United States Patent
Lin et al.

(10) Patent No.: US 9,876,069 B1
(45) Date of Patent: Jan. 23, 2018

(54) HIGH-VOLTAGE SEMICONDUCTOR DEVICE AND METHOD FOR MANUFACTURING THE SAME

(71) Applicant: Vanguard International Semiconductor Corporation, Hsinchu (TW)

(72) Inventors: Chih-Wei Lin, Jhubei (TW); Pao-Hao Chiu, Kaohsiung (TW); Keng-Yu Lin, Caotun Township (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/598,566

(22) Filed: May 18, 2017

(51) Int. Cl.
H01L 29/51 (2006.01)
H01L 29/06 (2006.01)
H01L 29/78 (2006.01)
H01L 29/66 (2006.01)

(52) U.S. Cl.
CPC ...... *H01L 29/0611* (2013.01); *H01L 29/0649* (2013.01); *H01L 29/66689* (2013.01); *H01L 29/7816* (2013.01)

(58) Field of Classification Search
CPC .............................. H01L 29/511; H01L 29/0611
See application file for complete search history.

(56) References Cited

U.S. PATENT DOCUMENTS

| | | | | |
|---|---|---|---|---|
| 6,225,669 B1* | 5/2001 | Long | ................ | H01L 21/28105 257/221 |
| 6,586,808 B1* | 7/2003 | Xiang | ............... | H01L 21/28105 257/333 |
| 6,632,714 B2* | 10/2003 | Yoshikawa | ......... | G11C 11/5671 257/E21.21 |
| 6,787,451 B2* | 9/2004 | Shimamoto | ......... | H01L 21/0214 257/E21.01 |
| 7,161,203 B2* | 1/2007 | Basceri | ............ | H01L 21/28194 257/296 |
| 7,507,611 B2* | 3/2009 | Park | .................. | H01L 21/28202 438/149 |

(Continued)

FOREIGN PATENT DOCUMENTS

TW 201214559 A1 4/2012
TW 201246543 A1 11/2012
TW 201709280 A 3/2017

*Primary Examiner* — Eugene Lee
(74) *Attorney, Agent, or Firm* — Birch, Stewart, Kolasch & Birch, LLP

(57) ABSTRACT

A high-voltage semiconductor device is provided. The device includes a semiconductor substrate including a high-voltage well region. The device further includes a gate dielectric structure and a gate. The gate dielectric structure includes a first dielectric layer over the high-voltage well region and a second dielectric layer over the first dielectric layer. The second dielectric layer has a U-shaped or ring-shaped contour as viewed from a top-view aspect, so as to form an opening exposing the first dielectric layer. The gate is disposed over the second dielectric layer and extends onto the exposed first dielectric layer via the opening. The device further includes a drift doping region in the high-voltage well region and a source/drain doping region in the drift doping region. A method for fabricating the high-voltage semiconductor device is also provided.

18 Claims, 5 Drawing Sheets

(56) References Cited

U.S. PATENT DOCUMENTS

| | | | | |
|---|---|---|---|---|
| 7,825,479 | B2* | 11/2010 | Booth, Jr. | H01L 23/5252 |
| | | | | 257/395 |
| 8,546,871 | B2* | 10/2013 | Huang | H01L 29/7923 |
| | | | | 257/324 |
| 9,287,362 | B1* | 3/2016 | Basu | H01L 29/152 |
| 2005/0176203 | A1* | 8/2005 | Chang | H01L 21/28282 |
| | | | | 438/261 |
| 2006/0001075 | A1* | 1/2006 | Shih | H01L 21/28282 |
| | | | | 257/315 |
| 2015/0270359 | A1* | 9/2015 | Basker | H01L 21/76831 |
| | | | | 438/151 |

* cited by examiner

HIGH-VOLTAGE SEMICONDUCTOR DEVICE AND METHOD FOR MANUFACTURING THE SAME

BACKGROUND

Field of the Disclosure

The present disclosure relates to a semiconductor technology, and in particular, it relates to a high-voltage semiconductor device having a gate dielectric structure with an non-uniform thickness.

Description of the Related Art

High-voltage semiconductor technology is applied in integrated circuits (ICs) with high voltages and high power. Traditional high-voltage semiconductor devices such as double diffused drain MOSFET (DDDMOSFETs) and lateral diffused MOSFET (LDMOSFET) are mainly used in devices with at least 18 volts or higher. The advantages of high-voltage device technology include cost effectiveness and process compatibility, and thus high-voltage device technology has been widely used in display driver IC devices, and power supply devices, and in such fields as power management, communications, autotronics, and industrial control.

Because of the properties of compactness and high output current of the DDDMOSFET, it has been widely used in switch regulars. A double diffused drain (DDD) is formed of two implantation/doping regions that serve as a source or drain in a high-voltage MOSFET device. Herein, the term "high-voltage MOSFET device" refers to a transistor device having a high breakdown voltage (BV).

When a DDDMOSFET is designed, low on-resistance ($R_{on}$) and high breakdown voltage (BV) are two main concerns. In DDDMOSFET design, the space between the drain and the channel region may be reduced, thereby reducing the on-resistance. In such cases, however, the high breakdown voltage of DDDMOSFET is deduced and the leakage is increased. Namely, DDDMOSFET designs often involve a tradeoff between low on-resistance and high breakdown voltage.

Therefore, there is a need to develop a high-voltage semiconductor device and a method for manufacturing the same that are capable of addressing the problems described above.

SUMMARY

In some embodiments of the disclosure, a high-voltage semiconductor device is provided. The high-voltage semiconductor device includes a semiconductor substrate including a high-voltage well region. The device further includes a gate dielectric structure and a gate. The gate dielectric structure includes a first dielectric layer over the high-voltage well region and a second dielectric layer over the first dielectric layer. The second dielectric layer has a U-shaped or ring-shaped contour as viewed from a top-view aspect, so as to form an opening exposing the first dielectric layer. The gate is disposed over the second dielectric layer and extends onto the exposed first dielectric layer via the opening. The device further includes a drift doping region in the high-voltage well region and a source/drain doping region in the drift doping region.

In some embodiments of the disclosure, a method for fabricating a high-voltage semiconductor device is provided. The method includes providing a semiconductor substrate including a high-voltage well region. A first dielectric layer is formed over the high-voltage well region. A drift doping region is formed in the high-voltage well region. A second dielectric layer is formed over the first dielectric layer. The second dielectric layer and the first dielectric layer form a gate dielectric structure. The second dielectric layer has a U-shaped or ring-shaped contour as viewed from a top-view aspect, so as to form an opening exposing the first dielectric layer. A gate is formed over the second dielectric layer and fills the opening. A source/drain doping region is formed in the drift doping region.

BRIEF DESCRIPTION OF THE DRAWINGS

The present disclosure can be further understood by reading the subsequent detailed description and examples with references made to the accompanying drawings, wherein.

DETAILED DESCRIPTION

Figure 1A:
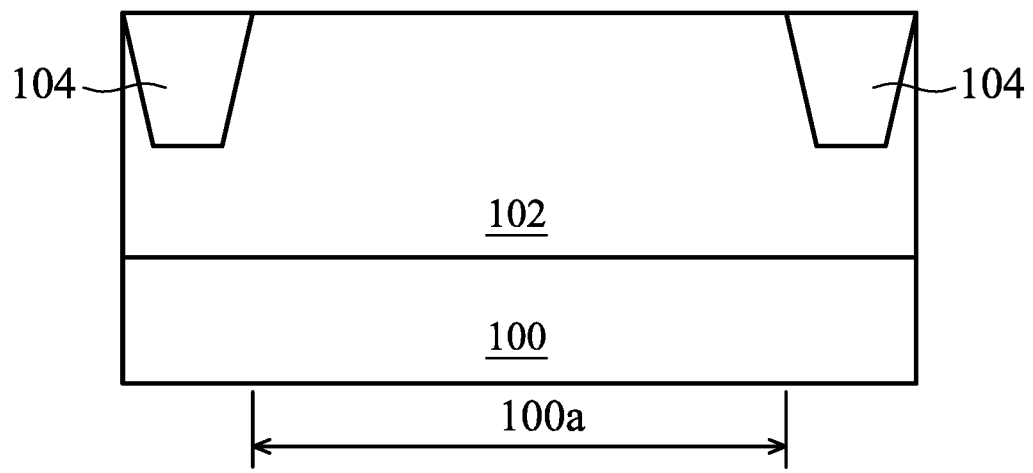
FIGS. 1A to 1E are cross sections of a method for fabricating a high-voltage semiconductor device according to one embodiment of the present disclosure.
Figure 1B:
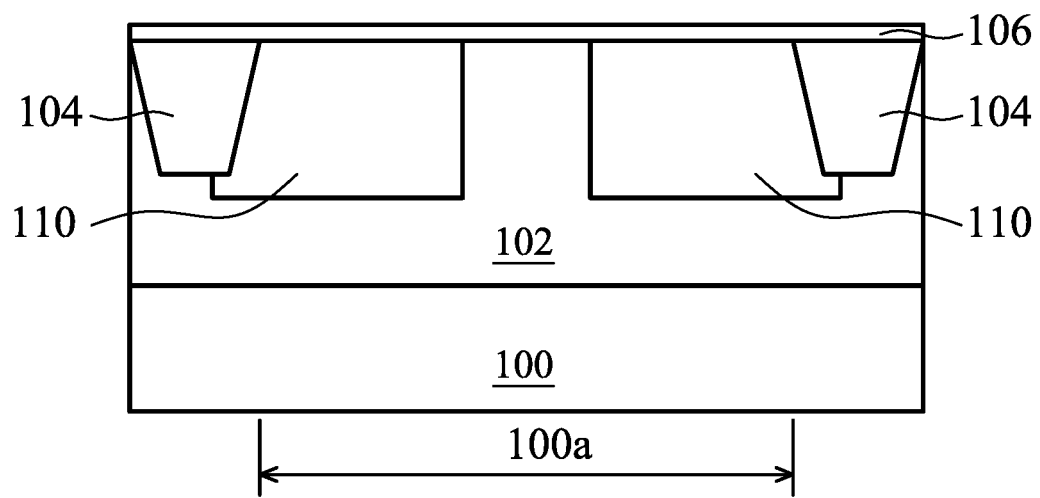

The following description is of the best-contemplated mode of carrying out the disclosure. This description is made for the purpose of illustrating the general principles of the disclosure and should not be taken in a limiting sense. These are, of course, merely examples and are not intended to be limited. In addition, the disclosure may repeat reference numerals and/or letters in the various examples. This repetition is for the purpose of simplicity and clarity and does not in itself dictate a relationship between the various embodiments and/or configurations discussed.

An exemplary embodiment of the present disclosure provides a high-voltage semiconductor device, such as a DDDMOSFET, which utilizes a U-shaped or ring-shaped gate dielectric layer to enhance the breakdown voltage of a high-voltage semiconductor device. As a result, when the space between the drain and the channel region and the size of the high-voltage semiconductor device are reduced to improve the on-resistance and reduce the leakage, the high-voltage semiconductor device is still capable of having a suitable or desired breakdown voltage.

Figure 1C:
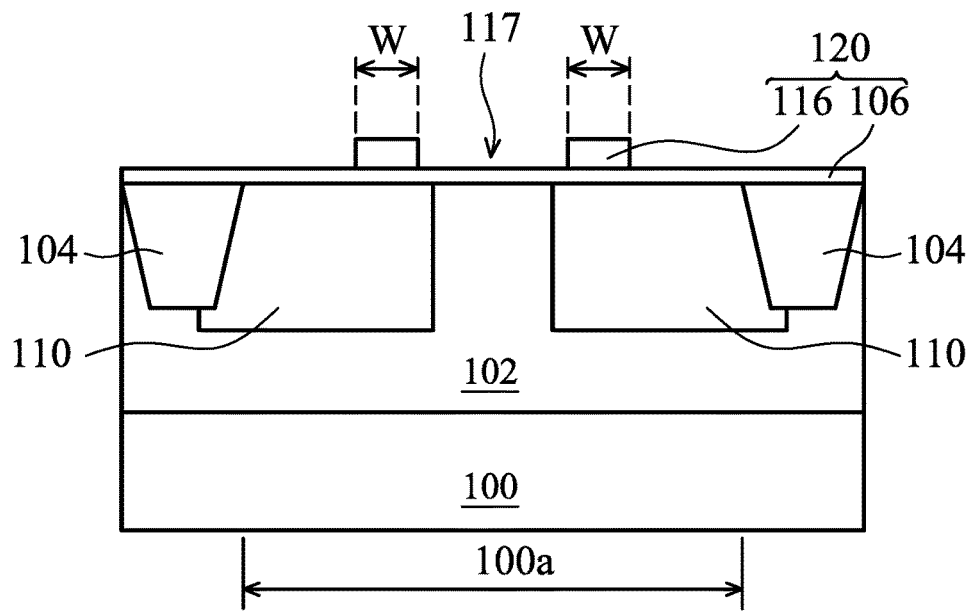
Figure 1D:
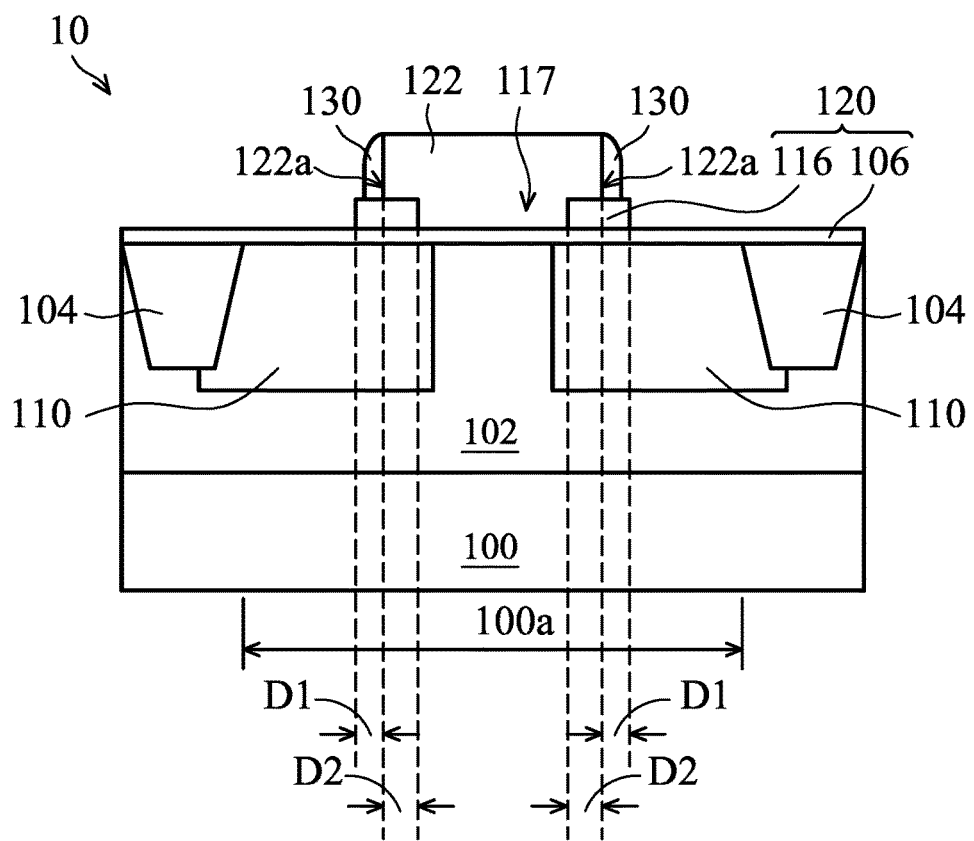
Figure 1E:
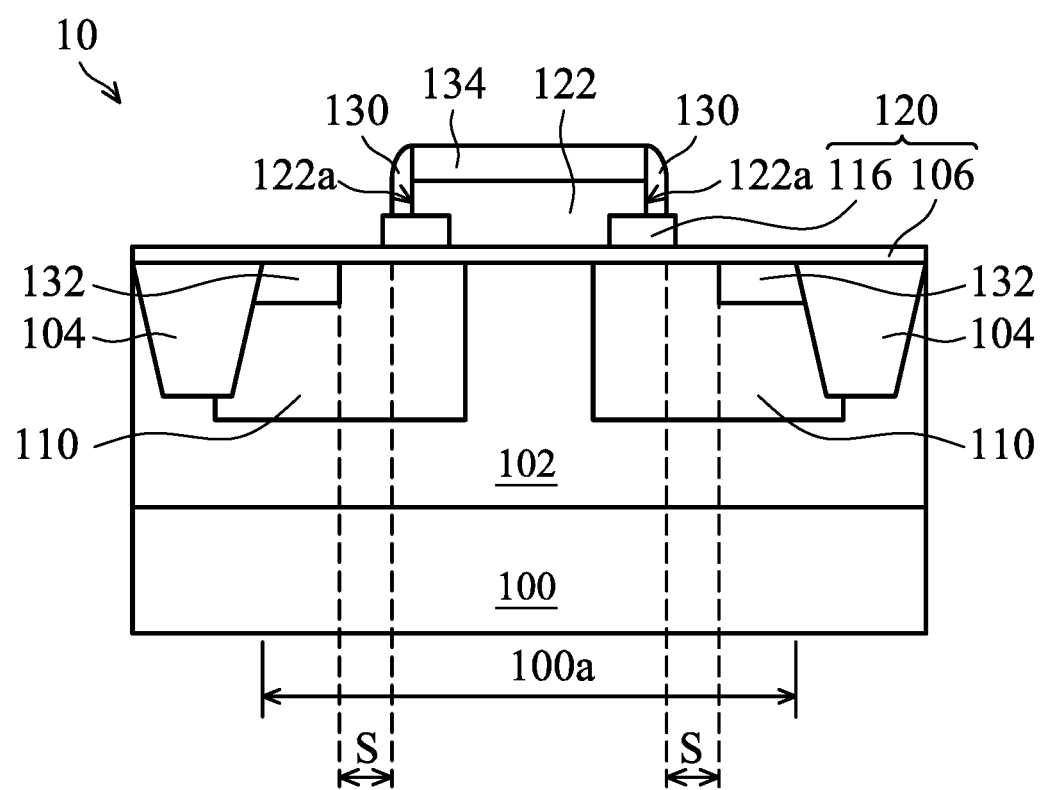

Refer to FIG. 1E, which illustrates a cross section of an exemplary embodiment of a high-voltage semiconductor device 10 according to the present disclosure. In the embodiment, the high-voltage semiconductor device 10 includes a semiconductor substrate 100 including a high-voltage well region 102 and at least an isolation structure 104. The isolation structure 104, such as a trench isolation structure defines an active region 100a in the high-voltage well region 102.

In one embodiment, the semiconductor substrate 100 has a first conductivity type, such as a P-type or N-type. Moreover, the high-voltage well region 102 of the high-voltage semiconductor device 10 has the first conductivity type. In one example, the high-voltage well region 102 is P-type and has a doping concentration of about $5.0\times10^{16}$ ions/cm$^3$. In another example, the high-voltage well region 102 is N-type and has a doping concentration of about $6.0 \times 10^{16}$ ions/cm$^3$.

In the embodiment, the high-voltage semiconductor device 10 further includes a gate dielectric structure 120, a gate 122 overlying the gate dielectric structure 120, and gate spacers 130 on two opposite sidewalls 122a of the gate 122.

In the embodiment, the gate dielectric structure 120 includes a first dielectric layer 106 and a second dielectric layer 116 overlying the first dielectric layer 106. In one embodiment, the first dielectric layer 106 is disposed over the high-voltage well region 102, covers the entire active region 100a and extends onto the isolation structure 104. In one embodiment, the first dielectric layer 106 may comprise silicon dioxide and have a thickness in a range of about 300 Å to 500 Å.

The second dielectric layer 116 is disposed over the high-voltage well region 102. The second dielectric layer 116 is a patterned dielectric layer and does not cover the entire active region 100a or extend onto the isolation structure 104. As a result, the second dielectric layer 116 and the first dielectric layer 106 form a step-type gate dielectric structure 120 with a non-uniform thickness. In one embodiment, the second dielectric layer 116 may have a thickness in a range of about 500 Å to 700 Å. Moreover, in one embodiment, the second dielectric layer 116 may comprise the same material as that of the first dielectric layer 106, such as silicon dioxide. In some embodiments, the second dielectric layer 116 may comprise a different material than the first dielectric layer 106. For example, the first dielectric layer 106 may comprise silicon dioxide and the second dielectric layer 116 may comprise silicon nitride, silicon oxynitride or another high dielectric constant dielectric material (e.g., HfO$_2$, ZrO$_2$, Al$_2$O$_3$, TiO$_2$, and the like).

In one embodiment, the second dielectric layer 116 has an opening 117 (as indicated in FIG. 1C) that exposes the first dielectric layer 106. The opening 117 substantially corresponds to the channel region (not shown) of the high-voltage semiconductor device 10.

Figure 2A:
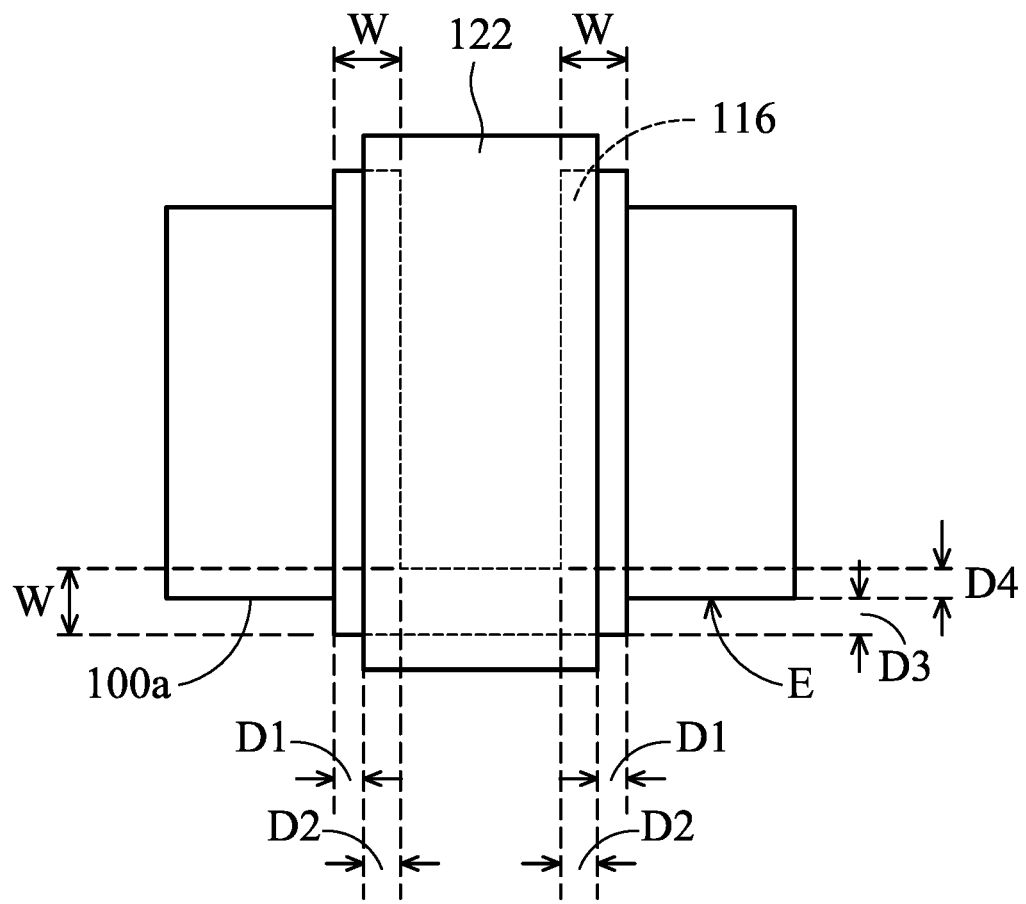
FIG. 2A is a plan view of a gate dielectric structure of a high-voltage semiconductor device according to one embodiment of the present disclosure.

Refer to FIG. 2A, which illustrates a plan view of a gate dielectric structure 120 of a high-voltage semiconductor device 10 according to one embodiment of the present disclosure. In order to simplify the diagram, only the second dielectric layer 116 of the gate dielectric structure 120 is depicted and the first dielectric layer 106 is not shown. In the embodiment, the second dielectric layer 116 has a U-shaped contour as viewed from a top-view aspect, so as to form the opening 117 exposing the first dielectric layer 106.

Figure 2B:
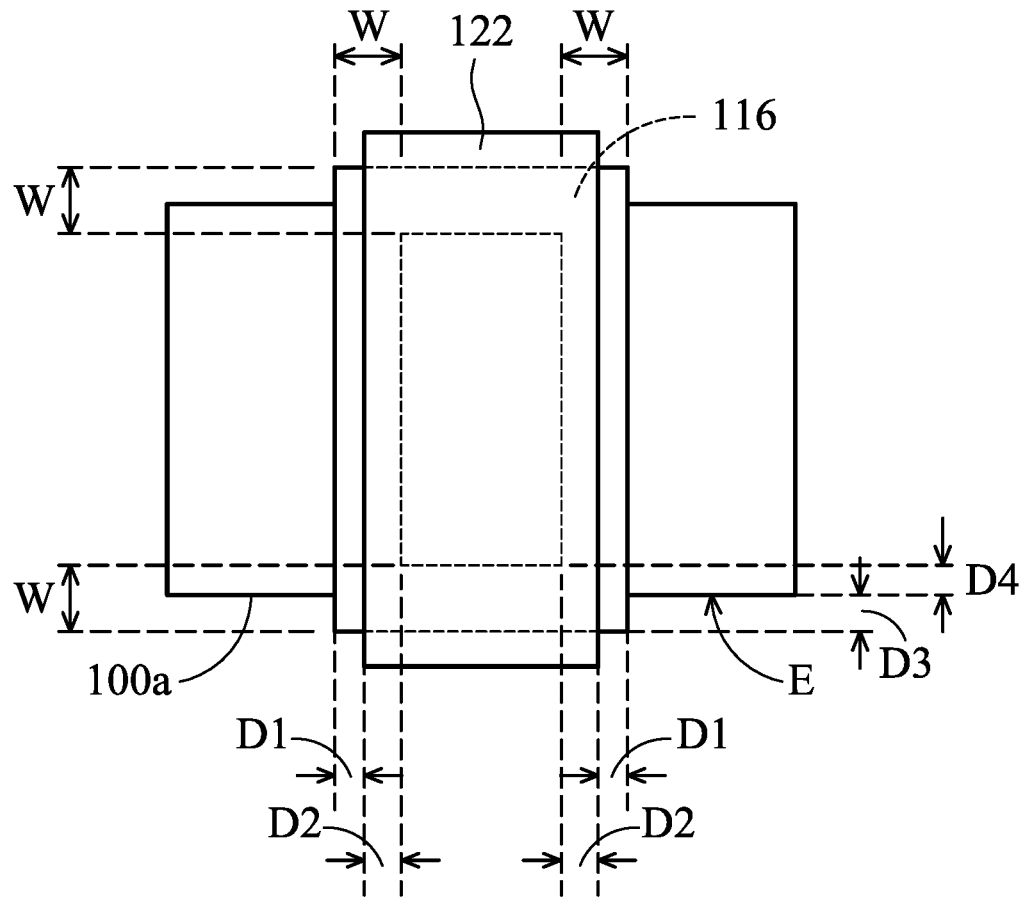
FIG. 2B is a plan view of a gate dielectric structure of a high-voltage semiconductor device according to another embodiment of the present disclosure.

Moreover, refer to FIG. 2B, which illustrates a plan view of a gate dielectric structure 120 of a high-voltage semiconductor device 10 according to another embodiment of the present disclosure. In order to simplify the diagram, only the second dielectric layer 116 of the gate dielectric structure 120 is depicted and the first dielectric layer 106 is not shown. In the embodiment, the second dielectric layer 116 has a ring-shaped contour as viewed from a top-view aspect, so as to form the opening 117 exposing the first dielectric layer 106.

In the embodiment, the gate 122 is disposed over the second dielectric layer 116 and entirely fills the opening 117, so that the gate 122 extends onto the first dielectric layer 106 via the opening 117. In one embodiment, the gate 122 may comprise polysilicon and have a top doping region 134 that reduces the contact resistance of the gate 122.

In one embodiment, the second dielectric layer 116 with a U-shaped or ring-shaped contour as viewed from a top-view aspect protrudes from the sidewall 122a of the gate 122 by a first distance D1, so that a portion of the second dielectric layer 116 is under each gate spacer 130. In this case, the second dielectric layer 116 extends beneath the gate 122 from the sidewall 122a of the gate 122 by a second distance D2 that is greater than the first distance D1, as shown in FIGS. 2A and 2B. For example, the second dielectric layer 116 with a U-shaped or ring-shaped contour as viewed from a top-view aspect has a width W (e.g., 0.3 µm). Moreover, the first distance D1 may be 0.1 µm and the second distance D2 may be 0.2 µm. Namely, the sum of the first distance D1 and the second distance D2 is equal to the width W of the second dielectric layer 116.

Additionally, as viewed from a top-view aspect, a portion of the second dielectric layer 122 perpendicular to the gate 122 protrudes outwardly from an edge E of the active region 100a by a third distance D3, as shown in FIGS. 2A and 2B. In this case, the second dielectric layer 116 extends from the edge E of the active region 100a toward the active region 100a by a fourth distance D4 that is less than the third distance D3. For example, the third distance D3 may be 0.2 µm and the fourth distance D4 may be 0.1 µm. Also, the sum of the third distance D3 and the fourth distance D4 is equal to the width W of the second dielectric layer 116.

In the embodiment, the high-voltage semiconductor device 10 further includes drift doping regions 110 and source/drain doping regions 132. The drift doping regions 110 are symmetrically disposed in the high-voltage well region 102 on both opposite sides of the gate 122 and adjacent to the isolation structure 104. Moreover, the source/drain doping regions 132 are correspondingly disposed in the drift doping regions 110 and adjacent to the isolation structure 104. In one embodiment, the high-voltage well region 102 and the source/drain doping regions 132 have the first conductivity type and the drift doping regions 110 have the second conductivity type that is different from the first conductivity type of the high-voltage well region 102. In one example, the first conductivity type is P-type and the second conductivity type is N-type. In another example, the first conductivity type is N-type and the second conductivity type is P-type. In one embodiment, the source/drain doping region 132 has a doping concentration greater than that of the drift doping region 110 serving as a double diffused drain. Moreover, the source/drain doping region 132 has the same conductivity type and doping concentration as those of the top doping region 134.

In one embodiment, the source/drain doping region 132 may be separated from the gate spacer 130 by a space S, so as to reduce the leakage of the high-voltage semiconductor device 10.

Next, refer to FIGS. 1A to 1E, which are cross sections of a method for fabricating a high-voltage semiconductor device 10 according to one embodiment of the present disclosure. In FIG. 1A, a semiconductor substrate 100 is provided. The semiconductor substrate 100 includes a high-voltage well region 102 and at least an isolation structure 104. The isolation structure 104 (such as a trench isolation structure) defines an active region 100a in the high-voltage well region 102. In the embodiment, the semiconductor substrate 100 may be a silicon substrate, a SiGe substrate, a bulk semiconductor substrate, a compound semiconductor substrate, a silicon-on-insulator (SOI) substrate or another well-known semiconductor substrate.

In one embodiment, the high-voltage well region 102 has a first conductivity type, such as a P-type or N-type. In one example, the high-voltage well region 102 is P-type and has a doping concentration of about $5.0 \times 10^{16}$ ions/cm$^3$. In another example, the high-voltage well region 102 is N-type and has a doping concentration of about $6.0 \times 10^{16}$ ions/cm$^3$.

Refer to FIG. 2B, a first dielectric layer 106 may be formed over the high-voltage well region 102 by a thermal oxidation process or another suitable deposition process (e.g., a chemical vapor deposition process). In one embodiment, the first dielectric layer 106 covers the entire active region 100a and extends onto the isolation structure 104. In one embodiment, the first dielectric layer 106 may have a thickness in a range of about 300 Å to 500 Å. Moreover, the first dielectric layer 106 may comprise silicon dioxide. In one embodiment, an annealing process, such as a rapid thermal annealing (RTA) process, may be performed on the first dielectric layer 106 after forming the first dielectric layer 106.

Next, an implantation mask (not shown) is formed by a lithography process. Thereafter, an ion implantation process may be performed, so as to form drift doping regions 110 with a second conductivity type that is different from the first conductivity type in the high-voltage well region 102 corresponding to the active region 100a. Moreover, a channel region (not shown) is also defined between the drift doping regions 110. In one example, the first conductivity type is P-type and the second conductivity type is N-type. In another example, the first conductivity type is N-type and the second conductivity type is P-type.

In one embodiment, the depth of the drift doping region 110 is greater than that of the isolation structure 104. Moreover, an annealing process, such as an RTA process, may be performed on the drift doping regions 110 after forming the drift doping regions 110, so that the drift doping regions 110 extend beneath the isolation structure 104.

Refer to FIG. 1C, a second dielectric layer 116 is formed over the first dielectric layer 106 by a suitable deposition process (e.g., a chemical vapor deposition process), a lithography process, and an etching process (e.g., a dry etching or wet etching process), in which the second dielectric layer 116 has an opening 117 exposing the first dielectric layer 106. The opening 117 substantially corresponds to the channel region (not shown). Moreover, the first dielectric layer 106 and the second dielectric layer 116 form a step-type gate dielectric structure 120 with a non-uniform thickness.

In one embodiment, the second dielectric layer 116 has a U-shaped contour as viewed from a top-view aspect (as shown in FIG. 2A) and has a width W. In some embodiments, the second dielectric layer 116 has a ring-shaped contour as viewed from a top-view aspect (as shown in FIG. 2B). In one embodiment, the second dielectric layer 116 has a thickness in a range of about 500 Å to 700 Å. Moreover, in one embodiment, the second dielectric layer 116 may comprise the same material as that of the first dielectric layer 106, such as silicon dioxide. In some embodiments, the second dielectric layer 116 may comprise a different material than the first dielectric layer 106. For example, the first dielectric layer 106 may comprise silicon dioxide and the second dielectric layer 116 may comprise silicon nitride, silicon oxynitride or another high dielectric constant dielectric material (e.g., $HfO_2$, $ZrO_2$, $Al_2O_3$, $TiO_2$, and the like).

Refer to FIG. 1D, a gate 122 may be formed over the second dielectric layer 116 and fill the opening 117 by a suitable deposition process (e.g., a chemical vapor deposition process), a lithography process, and an etching process (e.g., a dry etching or wet etching process). In one embodiment, the gate 122 may be formed of polysilicon. In the embodiment, the gate 122 that fills the opening 117 has a T-shaped contour as viewed from a cross-sectional aspect. As a result, the electric field beneath the edge of the gate 122 and the gate-drain capacitance ($C_{gd}$) can be reduced via the second dielectric layer 116 with a U-shaped or ring-shaped contour as viewed from a top-view aspect.

Next, gate spacers 130 are formed on two opposite sidewalls 122a of the gate 122. In one embodiment, as shown in FIGS. 2A and 2B, the second dielectric layer 116 with a U-shaped or ring-shaped contour as viewed from a top-view aspect protrudes from the sidewall 122a of the gate 122 by a first distance D1, so that a portion of the second dielectric layer 116 is under each gate spacer 130. In this case, the second dielectric layer 116 extends beneath the gate 122 from the sidewall 122a of the gate 122 by a second distance D2 that is greater than the first distance D1. Moreover, as viewed from a top-view aspect, a portion of the second dielectric layer 122 perpendicular to the gate 122 protrudes outwardly from an edge E of the active region 100a by a third distance D3. In this case, the second dielectric layer 116 extends from the edge E of the active region 100a toward the active region 100a by a fourth distance D4 that is less than the third distance D3.

Refer to FIG. 1E, an implantation mask (not shown) is formed by a lithography process. Thereafter, an ion implantation process may be performed, so as to form source/drain doping regions 132 with the first conductivity type in the corresponding drift doping regions 110 and simultaneously form a top doping region 134 in the top portion of the gate 122. In one embodiment, the source/drain doping regions 132 may be laterally separated from the gate spacers 130 by a space S. Namely, the source/drain doping regions 132 are not self-aligned to the gate spacers 130.

In one embodiment, the source/drain doping region 132 has a doping concentration greater than that of the drift doping region 110 serving as a double diffused drain. In one example, the source/drain doping region 132 and the top doping region 134 have the same conductivity type and the same doping concentration.

After forming the source/drain doping regions 132, a metallization layer (not shown) may be formed over the structure shown in FIG. 1E by a well-known metallization process. As a result, a high-voltage semiconductor device 10 is completed. In one embodiment, the metallization layer may include an interlayer dielectric (ILD) layer and an interconnect structure in the ILD layer. In one embodiment, the interconnect structure at least includes metal electrodes that are coupled to the source/drain regions 132 and top doping region 134.

According to the foregoing embodiments, since the high-voltage semiconductor device includes a step-type gate dielectric structure formed by the U-shaped or ring-shaped dielectric layer, the electric field beneath the edge of the gate and the gate-drain capacitance can be reduced, so as to increase the breakdown voltage of the high-voltage semiconductor device and enhance the switching characteristic of the high-voltage semiconductor device. As a result, in the high-voltage semiconductor device design, the source/drain doping region can be laterally separated from the gate spacer by a space, thereby reducing the leakage of the high-voltage semiconductor device. Moreover, the on-resistance of the high-voltage semiconductor device can be reduced by reducing the plane size of the high-voltage semiconductor device.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-voltage semiconductor device, comprising:
a semiconductor substrate comprising a high-voltage well region;
a gate dielectric structure comprising:
a first dielectric layer over the high-voltage well region; and
a second dielectric layer over the first dielectric layer, wherein the second dielectric layer has a U-shaped or ring-shaped contour as viewed from a top-view aspect, so as to form an opening exposing the first dielectric layer;
a gate over the second dielectric layer and extending onto the exposed first dielectric layer via the opening;
a drift doping region in the high-voltage well region; and
a source/drain doping region in the drift doping region.

2. The device as claimed in claim 1, further comprising a gate spacer on a sidewall of the gate, wherein the gate spacer is laterally separated from the source/drain doping region by a space.

3. The device as claimed in claim 2, wherein the second dielectric layer protrudes from the sidewall of the gate by a first distance, so that a portion of the second dielectric layer is under the gate spacer.

4. The device as claimed in claim 3, wherein the second dielectric layer extends beneath the gate from the sidewall of the gate by a second distance that is greater than the first distance.

5. The device as claimed in claim 1, wherein the first dielectric layer comprises the same material as that of the second dielectric layer.

6. The device as claimed in claim 1, wherein the first dielectric layer comprises a material that is different from that of the second dielectric layer.

7. The device as claimed in claim 1, wherein the first dielectric layer has a thickness in a range of 300 Å to 500 Å and the second dielectric layer has a thickness in a range of 500 Å to 700 Å.

8. The device as claimed in claim 1, wherein the high-voltage well region and the source/drain doping region have a first conductivity type and the drift doping region has a second conductivity type that is different from the first conductivity type.

9. The device as claimed in claim 1, wherein the gate has a top doping region that has the same conductivity type and the same doping concentration as those of the source/drain doping region.

10. A method for fabricating a high-voltage semiconductor device, comprising:
providing a semiconductor substrate comprising a high-voltage well region;
forming a first dielectric layer over the high-voltage well region;
forming a drift doping region in the high-voltage well region;
forming a second dielectric layer over the first dielectric layer, wherein the second dielectric layer and the first dielectric layer form a gate dielectric structure, and wherein the second dielectric layer has a U-shaped or ring-shaped contour as viewed from a top-view aspect, so as to form an opening exposing the first dielectric layer;
forming a gate over the second dielectric layer and filling the opening; and
forming a source/drain doping region in the drift doping region.

11. The method as claimed in claim 10, further comprising forming a gate spacer on a sidewall of the gate, wherein the gate spacer is laterally separated from the source/drain doping region by a space.

12. The method as claimed in claim 11, wherein the second dielectric layer protrudes from the sidewall of the gate by a first distance, so that a portion of the second dielectric layer is under the gate spacer.

13. The method as claimed in claim 12, wherein the second dielectric layer extends beneath the gate from the sidewall of the gate by a second distance that is greater than the first distance.

14. The method as claimed in claim 13, wherein the first dielectric layer comprises the same material as that of the second dielectric layer.

15. The method as claimed in claim 10, wherein the first dielectric layer comprises a material that is different from that of the second dielectric layer.

16. The method as claimed in claim 10, wherein the first dielectric layer has a thickness in a range of 300 Å to 500 Å and the second dielectric layer has a thickness in a range of 500 Å to 700 Å.

17. The method as claimed in claim 10, wherein the high-voltage well region and the source/drain doping region have a first conductivity type and the drift doping region has a second conductivity type that is different from the first conductivity type.

18. The method as claimed in claim 10, further comprising forming a top doping region in the gate, wherein the top doping region has the same conductivity type and the same doping concentration as those of the source/drain doping region.

* * * * *